United States Patent
Hirano et al.

(10) Patent No.: US 7,383,023 B2
(45) Date of Patent: Jun. 3, 2008

(54) COMMUNICATION APPARATUS

(75) Inventors: Takayuki Hirano, Tokyo (JP); Yasuhiko Suzuki, Tokyo (JP)

(73) Assignee: Hitachi Kokusai Electric Inc., Tokyo (JP)

(*) Notice: Subject to any disclaimer, the term of this patent is extended or adjusted under 35 U.S.C. 154(b) by 688 days.

(21) Appl. No.: 11/074,871

(22) Filed: Mar. 9, 2005

(65) Prior Publication Data

US 2005/0245213 A1    Nov. 3, 2005

(30) Foreign Application Priority Data

Apr. 28, 2004 (JP) ............................. 2004-132979

(51) Int. Cl.
*H04B 1/00* (2006.01)
(52) U.S. Cl. ........................ 455/69; 455/103; 455/126; 455/115.1; 455/91
(58) Field of Classification Search .................. 455/69
See application file for complete search history.

(56) References Cited

U.S. PATENT DOCUMENTS 3,781,703 A * 12/1973 Duty ........................... 330/52

\* cited by examiner

*Primary Examiner*—Lana N. Le
*Assistant Examiner*—Ajibola Akinyemi
(74) *Attorney, Agent, or Firm*—Wenderoth, Lind & Ponack, L.L.P.

(57) ABSTRACT

In a communication apparatus, effective automatic power control (APC) is realized, transmission object signal level changing units change a level of a transmission object signal of each channel, and transmission filter units carry out filtering for a signal of each channel after its level was changed with a characteristic for allowing a passage of a frequency component of each channel, and a transmission signal coupling unit couples signals of plural channels after the filtering was carried out, and an antenna transmits a coupled signal by wireless, and coupled signal dividing units divide a part of the coupled signal into a plurality of signals, and level detection filter units carry out filtering for each divided signal with an identical characteristic to the above-described characteristic and signal level detecting units detect a level of a signal of each channel after the filtering was carried out, and a transmission object signal level change mode controlling unit controls a level change mode of a transmission object signal of each channel on the basis of the detection result.

9 Claims, 8 Drawing Sheets

(a) Transmission power at antenna end (b) Transmission power after power detection variable filter

COMMUNICATION APPARATUS

BACKGROUND OF THE INVENTION

1. Field of the Invention

This invention relates to a communication apparatus which communicates a signal, and in particular, relates to a communication apparatus which realizes effective automatic power control (APC).

2. Description of the Relevant Art

A first background technology will be described.

Meanwhile, a matter, which will be described here, does not necessarily mean that every technologies are conventional technologies.

FIG. 6 shows a configuration example of a wireless communication apparatus which adopted an one channel (ch) APC system.

The wireless communication apparatus in this example is equipped with an input terminal 61, a variable amplifier 62, a power amplifier (PA) 63, a filter 64, an antenna 65, a directional coupler 66, a wave detector 67, a comparator 68, and a loop filter 69.

In the wireless communication apparatus of this example, power detection is carried out at the antenna 65 end, to carry out APC.

FIG. 7 shows a configuration example of a wireless communication apparatus in such a case that 4ch APC is carried out by use of the configuration shown in FIG. 6, and schematically, four pieces of the configurations shown in FIG. 6 are disposed in parallel.

Concretely speaking, the wireless communication apparatus in this example is equipped with four pieces of input terminals 71a to 71d, four pieces of variable amplifiers 72a to 72d, four pieces of power amplifiers (PA) 73a to 73d, four pieces of directional couplers 74a to 74d, four pieces of wave detectors 75a to 75d, a control section 76, four pieces of variable filters 77a to 77d, a coupling circuit (series resonant circuit) having four sets of coils 80a~80d and capacitors 81a~81d, and an antenna 79.

Meanwhile, in this specification, a component part of the variable filter having a coupling circuit for a plurality of channels (in this example, 4ch) is called as antenna sharing device.

In the wireless communication apparatus of this example, power detection is carried out in a final stage of the power amplifiers 73a to 73d which are a previous stage of the antenna sharing device (in this example, the variable filters 77a to 77d and the coupling circuit 78). Meanwhile, one antenna 79 is shared by a plurality of high frequency channels under the control of the antenna sharing device, and therefore, it is impossible to carry out power detection at the antenna 79 end. In addition, the control section 76 carries out such feedback control that transmission levels are compared and then, output correction is carried out, independently as to 4ch.

However, in the wireless communication apparatus shown in FIG. 7, there are problems as follows.

That is, in the antenna sharing device, minimum elongation frequency between respective channels becomes necessary, and when elongation frequency is insufficient, an impedance of another channel does not become infinitely great (open), and therefore, transmission power leaks to another channel through the coupling circuit 78, and a transmission loss fluctuates. In sum, a transmission loss of the antenna sharing device fluctuates, due to elongation frequency of each channel.

Then, in case that a transmission fluctuates due to setup frequency of the antenna sharing device, the antenna sharing device exists outside an APC loop, and therefore, in order to absorb fluctuation of the transmission loss of the antenna sharing device, some sort of correction becomes necessary. For example, conceivable is a method for carrying out output correction depending on elongation frequency, but this requires a device for monitoring frequency of all channels, and therefore, a device cost increases, which is not preferable.

In this manner, in the APC system shown in FIG. 7, there is such a problem that transmission power of each channel at the antenna 79 end fluctuates due to setup frequency of the antenna sharing device, and stable power control is impossible.

A second background technology will be described.

Meanwhile, a matter, which will be described here, does not necessarily mean that every technologies are conventional technologies.

FIG. 8 shows a configuration example of a wireless communication apparatus having an APC circuit which used a heat wave detector.

A wireless communication apparatus in this example is equipped with a modulating signal generator 91, a voltage-controlled gain controller 92, a power amplifier (PA) 93, a directional coupler 94, a heat wave detector 95, a differential amplifier 96, and an integrator 97.

The wireless communication apparatus in this example adopts an APC system by use of the heat wave detector 95, and uses the wave detector (heat wave detector) 95 which converts high frequency power into heat to carry out power measurement, and therefore, a wave detection level is not swayed by a wave form of modulation.

However, it takes time until a wave detection level becomes stable, and therefore, there is such a problem that it is not adequate to the APC loop which is locked at high speed.

In addition, FIG. 9 shows a configuration example of a wireless communication apparatus having an APC circuit which used a modulation correction coefficient.

The wireless communication apparatus in this example is equipped with a modulating signal generator 101, a voltage-controlled gain controller 102, a power amplifier (PA) 103, a directional coupler 104, a logarithmic amplifier (wave detector) 105, a reference voltage source 106, a differential amplifier 107, and an integrator 108.

The wireless communication apparatus in this example adopts the APC system by use of a modulation correction coefficient, and uses the logarithmic amplifier 105 as a wave detector, and therefore, there is no need to consider such time that a wave detection level becomes stable, like the configuration shown in FIG. 8.

However, a wave detection level changes due to a modulation wave form, and therefore, there is such a problem that there is a necessity to change a reference voltage of APC (output voltage from the reference voltage source 106) in tune with a type of modulation, by disposing a correction coefficient with respect to each type of modulation (modulation system). In addition, there is a limit in the number of correction coefficients, and therefore, there is a limit in types of modulations for which APC is available, and on this account, for example, there is such a problem that it becomes impossible to control even if the number of types of modulations increases in the future. In addition, in order to setup the correction coefficient, conceivable is such a configuration that, for example, a resistor volume and a ROM (Read Only Memory) table etc. are used, but there is such a problem that it is directly linked to cost rise. In addition, as to which type of modulation responsive signal is outputted, an instruction signal from the modulating signal generator 101 becomes necessary, and therefore, there is such a problem that control becomes complex.

[Patent Document 1] JP-A-2000-22581 publication

As shown in the above-described first background technology and the above-described second background technology, development of a communication apparatus which realizes effective automatic power control (APC) has been requested.

Concretely speaking, as shown in the above-described first background technology, development of such a communication apparatus that, for example, even in case that transmission power of each channel at the antenna end fluctuates due to setup frequency of the antenna sharing device, stable power control is possible, has been requested.

In addition, as shown in the above-described second background technology, development of such a communication apparatus that, for example, it does not take so much time until a wave detection level becomes stable, and it is applicable to the APC loop which is locked at high speed, and in addition, a wave detection level does not change due to a modulation wave form, and there is no need to change the APC reference voltage in tune with a type of modulation, has been requested.

The invention is a thing which was made in view of the suchlike conventional circumstances, and aims to provide a communication apparatus which realizes effective automatic power control (APC).

Concretely speaking, an object is to provide such a communication apparatus that, for example, even in case that transmission power of each channel at an antenna end fluctuates due to setup frequency of an antenna sharing device, stable power control is possible.

In addition, an object is to provide such a communication apparatus that, for example, it does not take so much time until a wave detection level becomes stable, and it is applicable to an APC loop which is locked at high speed, and in addition, there is no need to change a reference voltage of APC in tune with a type of modulation.

SUMMARY OF THE INVENTION

A first invention will be described.

In order to accomplish the above-described objects, a communication apparatus, which relates to the invention, communicates a signal in the following way.

That is, a transmission object signal level changing unit changes a level of a signal which becomes, as to each of plural channels, a transmission object of each channel. A transmission filter unit carries out filtering for a signal of each channel, of which a level was changed by the transmission object signal level changing unit, by a filtering characteristic for allowing passage of a frequency component of each channel, as to each of the plural channels. A transmission signal coupling unit couples signals of the plural channels, for which filtering was carried out by the transmission filter unit. An antenna transmits a signal which was coupled by the transmission signal coupling unit, by wireless.

Then, a coupled signal dividing unit divides a part of the coupled signal which is outputted from the transmission signal coupling unit to the antenna, into a plurality of signals (e.g., same number as the number of channels). A level detection filter unit carries out filtering each divided signal which was divided up by the coupled signal dividing unit, by a filtering characteristic which is tuned to an identical frequency to that of the filtering characteristic of the transmission filter unit, as to each of the plural channels. A signal level detecting unit detects a level of a signal of each channel, which was obtained by filtering due to the level detection filter unit. A transmission object signal level change mode controlling unit controls a mode of changing a level of a signal which becomes a transmission object of each channel, by the transmission object signal level changing unit, on the basis of a level of a signal of each channel, which was detected by the signal level detecting unit.

Therefore, for example, even in case that transmission power of each channel at an antenna end fluctuates due to setup frequency of an antenna sharing device, stable power control is possible. Then, it is possible to realize effective automatic power control (APC).

Here, as the number of plural channels, various numbers may be used.

In addition, in a plurality of channels, for example, frequencies, which are used for communications, are different to each other.

In addition, as the transmission object signal level changing unit, various ones may be used, and for example, it is possible to configure it by a variable amplifier which amplifies a signal with a variable gain (amplification amount) and in sum, increases a level of a signal, a variable attenuator which attenuates a signal with a variable gain (attenuation amount), and in sum, decreases a level of a signal, and so on.

In addition, as the transmission filter unit and the level detection filter unit, various ones may be used, and for example, it is possible to configure them by a band pass filter (BPF) which has a fixed or variable frequency characteristic, and so on.

In addition, as a mode of making a filtering characteristic of the transmission filter unit, identical to a filtering characteristic of the level detection filter unit as to each of the plural channels, for example, not only necessarily a mode of making them exactly identical but also a mode of having an error etc. with a practically effective level are included in the invention.

In addition, the transmission object signal level change mode controlling unit controls, for example, an amount of changing a level of a signal by the transmission object signal level changing unit, as control of a mode of changing a level of a signal by the transmission object signal level changing unit, and as a concrete example, controls an amplification amount and an attenuation amount.

In addition, for example, it is also possible to provide a configuration which is equipped with a signal attenuating unit which attenuates respective divided signals, between the coupled signal dividing unit and the level detection filter unit.

A second invention will be described.

In order to accomplish the above-described objects, a communication apparatus, which relates to the invention, communicates a signal in the following way.

That is, a modulating signal level changing unit changes a level of a modulating signal which becomes a transmission object. A pre-level change modulating signal level detecting unit detects a level of a modulating signal before its level is changed by the modulating signal level changing unit. A detection level predetermined value synthesizing unit synthesizes a level which was detected by the pre-level change modulating signal level detecting unit, and a predetermined value based on a transmission level which becomes a target, independently of a modulation system.

In addition, a post-level change modulating signal level detecting unit detects a level of a modulating signal after its level was changed by the modulating signal level changing unit, by an identical detection characteristic to that of the pre-level change modulating signal level detecting unit. A modulating signal level change mode controlling unit controls a mode of changing a level of a modulating signal, which becomes a transmission object, by the modulating signal level changing unit, on the basis of a difference of a synthesis result by the detection level predetermined value synthesizing unit, and a level which was detected by the post-level change modulating signal level detecting unit.

Here, as the pre-level change modulating signal level detecting unit and the post-level change modulating signal level detecting unit, various ones may be used, and for example, it is possible to use a wave detector such as a logarithmic amplifier.

Therefore, for example, it does not take so much time until a wave detection level becomes stable, and it is applicable to the APC loop which is locked at high speed, and there is no-need to change a reference voltage of APC in tune with a type of modulation. Then, it is possible to realize effective automatic power control (APC).

Here, as a type of modulation (modulation system) which is used for a modulating signal which becomes a transmission object, it is all right even if various ones are used.

In addition, as the modulating signal level changing unit, various ones may be used, and for example, it is possible to configure it by a variable amplifier which amplifies a signal with a variable gain (amplification amount), and in sum, increases a level of a signal, a variable attenuator which attenuates a signal with a variable gain (attenuation amount), and in sum, reduces a level of a signal, and so on.

In addition, as the predetermined value based on a transmission level which becomes a target independently from a modulation system, various values may be used, and for example, two or more values may be used, and as a concrete example, it is possible to use a reference value for modulation judgment, and a reference value for APC level.

In addition, as a mode of synthesizing a level which was detected by the pre-level change modulating signal level detecting unit and the predetermined value, for example, a mode of adding or a mode of subtracting etc. may be used, and in case that the predetermined value uses two or more values, synthesis may be carried out in different modes, respectively.

In addition, as a mode of making a detection characteristic of the pre-level change modulating signal level detecting unit, identical to a detection characteristic of the post-level change modulating signal level detecting unit, for example, not only a mode of making them exactly identical but also a mode of having an error etc. with a practical effective level are also included in the invention.

In addition, the modulating signal level change mode controlling unit controls, for example, an amount of changing a level of a signal by the modulating signal level changing unit, as control of a mode of changing a level of a signal by the modulating signal level changing unit, and as a concrete example, controls an amplification amount and an attenuation amount.

In addition, for example, it is also possible to provide a configuration which is equipped with a level filter unit such as a low pass filter (LPF) which carries out filtering of a level which was detected by the pre-level change modulating signal level detecting unit, and a configuration which is equipped with a control signal filter unit such as a low pass filter (LPF) which carries out filtering of a control signal for controlling the modulating signal level changing unit in the modulating signal level change mode controlling unit.

As described above, according to the communication apparatus which relates to the first invention, a level of a signal which becomes, as to each of plural channels, a transmission object of each channel is changed, and filtering is applied to a signal of each channel, of which level was changed by a filtering characteristic for allowing a passage of a frequency component of each channel, and signals of the plural channels for which the filtering was carried out are coupled, and the coupled signal is transmitted through the antenna by wireless, and on the occasion of this, a part of the coupled signal, which is outputted to the antenna, is divided into a plurality of signals, and as to each of the plural channels, filtering is applied to each divided signal, by a filtering characteristic which is identical to the above-described filtering characteristic, and a level of a signal of each channel, which was obtained by the filtering, is detected, and on the basis of the detected level of a signal of each channel, a mode of changing a level of a signal which becomes a transmission object of each channel is controlled, and therefore, for example, even in case that transmission power of each channel at an antenna end fluctuates due to setup frequency of an antenna sharing device, stable power control is possible, and it is possible to realize effective automatic power control (APC).

In addition, according to the communication apparatus which relates to the second invention, on the occasion of changing a level of a modulating signal which becomes a transmission object, a level of a modulating signal is detected before its level is changed, and the detected level and a predetermined value based on a transmission level which becomes a target independently from a modulation system are synthesized, and in addition, a level of a modulating signal is detected after its level was changed, by an identical detection characteristic to that of the above-described level detection, and on the basis of a difference of the above-described synthesis result and the detected level, a mode of changing a level of a modulating signal which becomes a transmission object is controlled, and therefore, for example, it does not take so much time until a wave detection level becomes stable, and it is also applicable to an APC loop which is locked at high speed, and in addition, there is no need to change a reference voltage of APC in tune with a type of modulation, and it is possible to realize effective automatic power control (APC).

BRIEF DESCRIPTION OF THE DRAWINGS

The invention, together with further advantage thereof, may best be understood by reference to the following description taken in conjunction with the accompanying drawings in which.

DETAILED DESCRIPTION OF THE EMBODIMENTS

Embodiments, which relate to the invention, will be described with reference to the drawings.

These examples show such a case that the invention was applied to a wireless communication apparatus which carries out multicarrier communication by use of a frequency hopping (FH) system. In case that the FH system is adopted, for example, as to a processing section which is common to a plurality of carrier frequencies (channels), it carries out control for switching in such a manner that processing, which corresponds to each carrier frequency, is carried out, in synchronization with such timing that carrier frequency is switched over, and in addition, as to a plurality of processing sections which are provided independently, in compliance with each of the plural carrier frequencies, it carries out control in such a matter that processing is carried out at timing of (at least) a carrier frequency which corresponds to itself, in synchronization with such timing that carrier frequency is switched over.

Embodiment 1

A first embodiment of the invention will be described.

Figure 1:
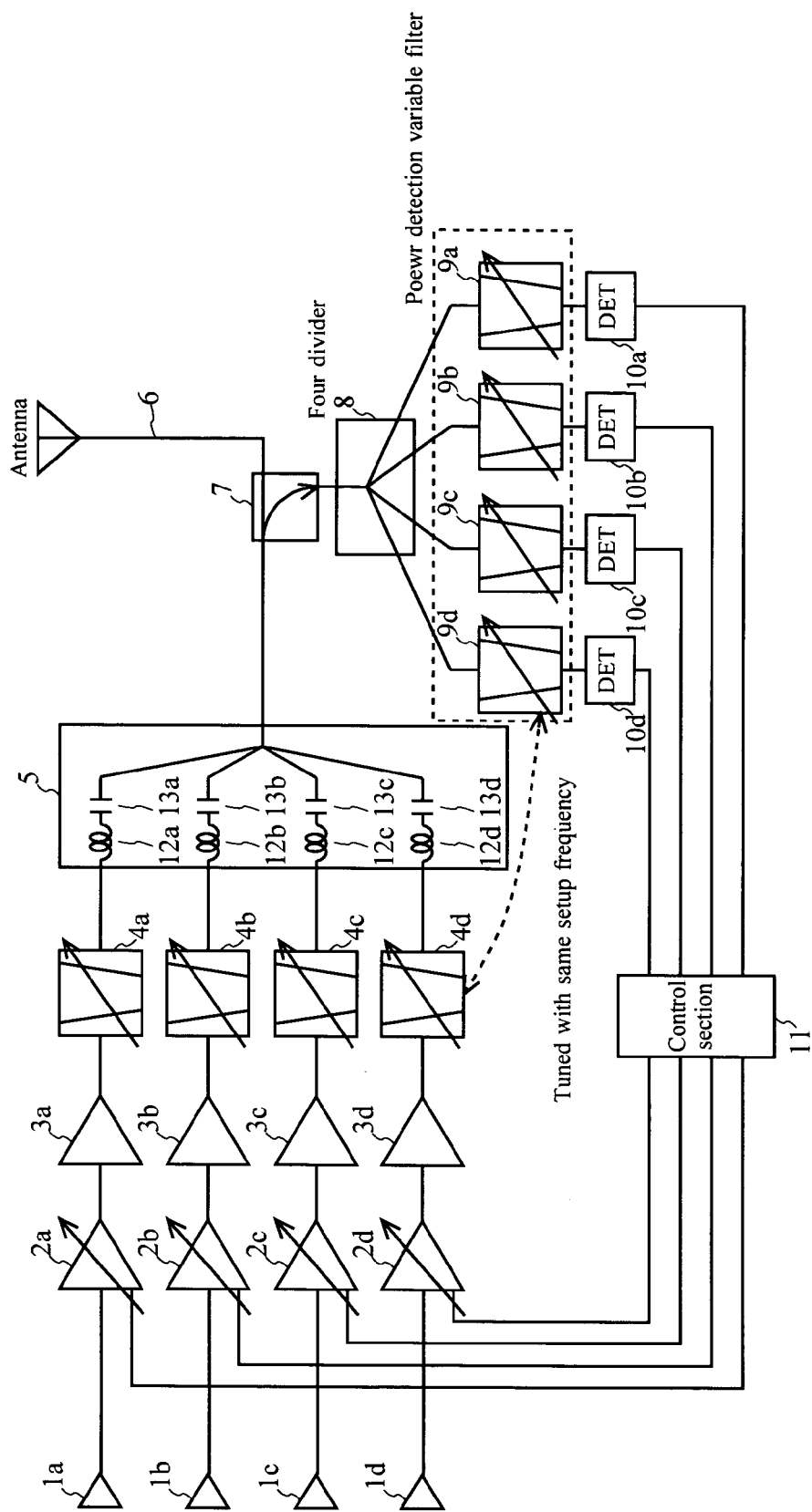
FIG. 1 is a view which shows a configuration example of a wireless communication apparatus which relates to a first embodiment of the invention.

FIG. 1 shows a configuration example of a transmitter which is equipped with a 4 channel (ch) antenna sharing device, as a configuration example of a wireless communication apparatus in this embodiment.

The wireless communication apparatus in this embodiment is equipped with four pieces of input terminals $1a$ to $1d$, four pieces of variable amplifiers $2a$ to $2d$, four pieces of power amplifiers (PA) $3a$ to $3d$, four pieces of variable filters (frequency variable filters) $4a$ to $4d$ which are configured by for example, band pass filters (BPF), a coupling circuit 5 which has four sets of coils $12a$ to $12d$ and capacitors $13a$ to $13d$, an antenna 6, a directional coupler 7, a four divider 8, four pieces of power detection variable filters (frequency variable filters) $9a$ to $9d$ which are configured by for example, band pass filters (BPF), four pieces of wave detectors $10a$ to $10d$, and a control section 11.

One example of an operation which is carried out by the wireless communication apparatus in this embodiment will be shown.

A signal, which is inputted from each input terminal $1a$ to $1d$, is inputted to each variable amplifier $2a$ to $2d$.

Each variable amplifier $2a$ to $2d$ amplifies an input signal with a gain which is controlled by the control section 11, and outputs the amplified signal to each power amplifier $3a$ to $3d$.

Each power amplifier $3a$ to $3d$ amplifies an input signal with a predetermined gain, and outputs the amplified signal to each variable filter $4a$ to $4d$.

Each variable filter $4a$ to $4d$ is controlled so as to be tuned with each carrier channel frequency (in this embodiment, each FH frequency), and carries out filtering of an input signal, and outputs it to each input terminal of the coupling circuit 5. As a configuration of each variable filter $4a$ to $4d$, for example, it is possible to use the same configuration as those of JP-A-10-98313 and JP-A-10-84256 publications.

The coupling circuit 5 has, at each input terminal, the coils $12a$~$12d$ and the capacitors $13a$ to $13d$ which are connected in series, and couples an input signal from each input terminal through a series resonant circuit of the coils $12a$ to $12d$ and the capacitors $13a$ to $13d$, and thereby, prevents a harmful effect due to such a matter that respective output terminals of the variable filters $4a$ to $4d$ are directly connected in parallel and coupled. A resonant frequency of the series resonant circuit is controlled in the same manner as a tuning frequency of a corresponding variable filter. Its detail is described in Japanese patent application 2003-303997.

The antenna 6 transmits the coupled signal which is inputted from the coupling circuit 5, by wireless.

The directional coupler 7 extracts a part of the coupled signal which is outputted from the coupling circuit 5 to the antenna 6, and outputs the extracted coupled signal to the four divider 8.

The four divider 8 divides an input signal into four pieces, and outputs each divided signal to each variable filter $9a$ to $9d$.

Each variable filter $9a$ to $9d$ is controlled so as to be tuned with a frequency of a channel of each carrier (in this embodiment, each FH frequency), and carries out filtering of an input signal, and outputs it to each wave detector $10a$ to $10d$.

Here, in this embodiment, each variable filter $4a$ to $4d$ in a transmission path and each variable filter $9a$ to $9d$ for power detection are tuned with the same setup frequency, respectively. Concretely speaking, the first variable filter $4a$ in the transmission path and the first variable filter $9a$ for power detection are tuned with the same setup frequency, and the second variable filter $4b$ in the transmission path and the second variable filter $9b$ for power detection are tuned with the same setup frequency, and the third variable filter $4c$ in the transmission path and the third variable filter $9c$ for power detection are tuned with the same setup frequency, and the fourth variable filter $4d$ in the transmission path and the fourth variable filter $9d$ for power detection are tuned with the same setup frequency.

Figure 2:
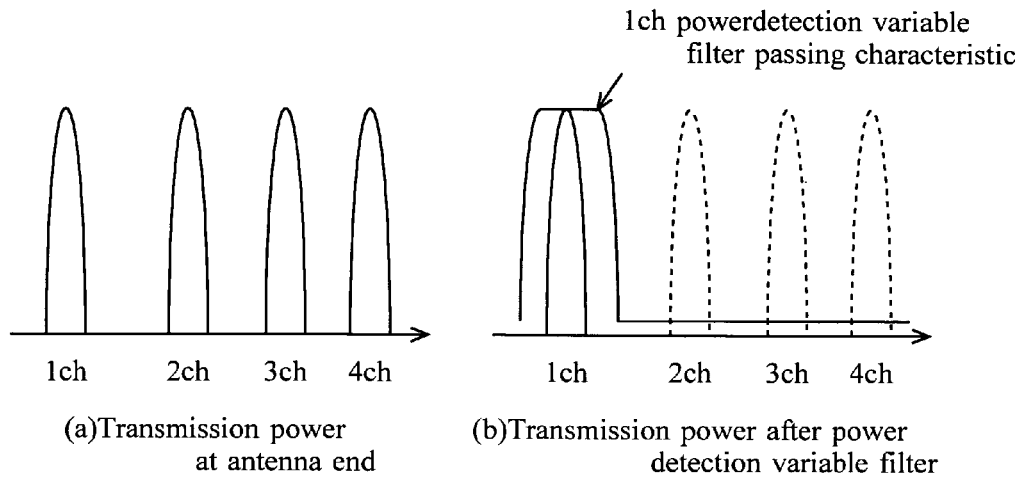
FIGS. 2A and 2B are views which show one example of an appearance of power detection.

FIGS. 2A, 2B show a concrete example of an appearance of power detection as to a first channel ("1ch"), as one example of an appearance of power detection by the power detection variable filters $9a$ to $9d$.

FIG. 2A shows one example of transmission power at the antenna 6 end, as to each of four channels ("1ch" to "4ch").

FIG. 2B shows one example of a passing characteristic and one example of transmission power after filtering, as to the power detection variable filter $9a$ in the first channel ("1ch"). Meanwhile, signals of the second to fourth channels ("2ch" to "4ch"), which are shown by a dotted line, are suppressed.

Each wave detector $10a$ to $10d$ detects an input signal, and outputs the wave detection result to the control section 11.

The control section 11 controls a gain of each variable amplifier 2a to 2d, on the basis of a level of each channel signal, which is specified by the wave detection result which is inputted from each wave detector 10a to 10d thereby to carry out automatic gain control (AGC). Here, the control section 11 controls the first variable amplifier 2a on the basis of the wave detection result from the first wave detector 10a, and controls the second variable amplifier 2b on the basis of the wave detection result from the second wave detector 10b, and controls the third variable amplifier 2c on the basis of the wave detection result from the third wave detector 10c, and controls the fourth variable amplifier 2d on the basis of the wave detection result from the fourth wave detector 10d.

Furthermore, the wireless communication apparatus of this embodiment will be described.

In the wireless communication apparatus of this embodiment, in the 4ch coupling circuit 5 in the antenna sharing circuit (in this embodiment, the variable filters 4a to 4d and the coupling circuit 5), a series resonant circuit is adopted. The series resonant circuit is matched at passing frequency but an out-of-band impedance becomes infinitely great (open). In case that the coupling circuit 5 and filters of plural channel (in this embodiment, the filters 4a to 4d of 4 channels) were coupled by utilizing this characteristic, a passing band of a certain channel is not influenced by another channel. Concretely speaking, for example, the second to fourth channels are viewed as open in case that they were viewed from the first channel, and therefore, a passing band of the first channel is not influenced by the second to fourth channels.

In addition, in the wireless communication apparatus of this embodiment, a radio frequency (RF) signal is extracted by the directional coupler 7 at the antenna 6 end, and the extracted signal is supplied to each power detection variable filter 9a to 9d of each channel by the ideal four divider 8. Each power detection variable filter 9a to 9d of each channel is made to be tuned with the same frequency as that of each variable filter 4a to 4d for band-limiting of a transmission path. Then, by each power detection variable filter 9a to 9d of each channel, transmission power of another channel is band-cut, and it is possible to detect only transmission power of a tuning frequency of each channel.

In this way, in the wireless communication apparatus of this embodiment, it is possible to realize APC with a level of the antenna 6 end, without being influenced by a transmission output of another channel, and by this means it is possible to realize stable APC without any output fluctuation due to the antenna sharing device.

In addition, the four divider 8 in this embodiment will be described.

For example, in case of using a filter which used a parallel resonance, there is such a case that an impedance becomes zero (0) outside the tuning frequency, and therefore, a coupler becomes necessary. On one hand, in case of using a filter which used a series resonance, an impedance becomes infinitely large (open) outside a band, and therefore, the coupler is unnecessary.

On this account, in case that the power detection variable filters 9a to 9d are of a configuration which utilized a parallel resonance, in the same manner as the variable filters 4a to 4d for transmission, a coupler (e.g., a circuit which is similar to the coupling circuit 5) becomes necessary. On one hand, in case that the power detection variable filters 9a to 9d were configured by a series resonance, the coupler is unnecessary.

Meanwhile, the power detection variable filters 9a to 9d may be configured, for example, by use of a parallel resonance, or may be configured by use of a series resonance.

In addition, in the wireless communication apparatus of this embodiment, for example, even if an input of the power detection variable filters 9a to 9d fluctuates, they are connected through a 4 port dividing and synthesizing device (in this embodiment, four divider 8), and therefore, interference between ports is low. Further, for example, an attenuator such as a resistor is disposed between the four divider 8 and each variable filter 9a to 9d, respectively, and when it is configured in such a manner that a signal after divided into four is inputted to each variable filter 9a to 9d for power detection through each attenuator, it is possible to hide most of fluctuation of an input impedance of the power detection variable filters 9a to 9d from view.

In addition, as the variable filters 4a to 4d for transmission and the variable filters 9a to 9d for power detection, for example, it is possible to use a filter which is called as an agile filter.

Meanwhile, in the variable filters 4a to 4d for transmission, for example, each channel is shared for transmission and reception, and in order to be able to receive by another channel, over transmitting with 10 W, an out-of-band attenuation amount of 50 dB for one channel is required, but in the variable filters 9a to 9d for power detection, for example, it does not become necessary that far, since it is all right if it is possible to measure only a transmission level.

As above, the wireless communication apparatus in this embodiment was equipped with M pieces of transmission amplifiers (M is an integer larger than 1) which amplify a transmission signal (in this embodiment, four pieces of the variable amplifiers 2a to 2d), variable filters for transmission and reception which allow a passage of frequency of transmission and reception signals of each of N pieces of channels (N is an integer more than M) for carrying out at least one of transmission or reception (in this embodiment, four pieces of the variable filters 4a to 4d), an antenna sharing device which connects N pieces (N is an integer more than 1) of channels to an antenna (in this embodiment, the variable filters 4a to 4d and the coupling circuit 5), a coupler which takes out a transmission signal to the antenna 6 (in this embodiment, the directional coupler 7), a divider which divides an output from the coupler into at least M pieces and outputs them (in this embodiment, the four divider 8), M pieces of power detection variable filters to which each of plural outputs from the divider is inputted and which is tuned with a frequency of a transmitting channel among N pieces of channels (in this embodiment, four pieces of the variable filters 9a to 9d), M pieces of detectors to which an output of each of the M pieces of power detection variable filters is inputted and which detects power (in this embodiment, four pieces of the wave detectors 10a to 10d), and the control section 11 which controls a gain of M pieces of the transmission amplifiers by the detected power.

Therefore, in the wireless communication apparatus of this embodiment, for example, even if a transmission loss of the antenna sharing device (the coupling circuit 5 and the variable filters 4a to 4d) fluctuated significantly, it is possible to carry out power detection at the antenna 6 end thereby to absorb fluctuation of the transmission loss of the antenna sharing device by the APC loop, and therefore, by stably carrying out power control at the antenna 6 end by use of the APC system, power fluctuation at the antenna 6 end is eliminated, and it is possible to realize delivery of stable transmission power (stability of a transmission output). For example, it is possible to make an APC control system more efficient, in a high speed tuning antenna sharing device.

In this way, in the wireless communication apparatus of this embodiment, the power detection variable filters 9a to 9d for detecting transmission power (transmission output) are allocated on the output side of the antenna sharing device, and power of individual channel carrier amplifier (in this embodiment, the variable amplifiers 2a to 2d) in such a case that multi channel carriers are synthesized and supplied to an antenna (antenna 6) is controlled. In this embodiment, in transmission power control in a multi channel sharing configuration which used the FH system, an antenna output is taken out by a coupler (in this embodiment the directional coupler 7), and divided into a plurality of pieces, and by a filer (in this embodiment, the variable filters 9a to 9d) which is tuned with each FH frequency (each carrier frequency), power is detected with respect to each carrier (with respect to each channel) to carry out APC with respect to each carrier.

In the wireless communication apparatus of this embodiment, for example, an isolation between channels is secured by an attenuation characteristic of a FH filter (in this embodiment, the variable filters 9a to 9d), and thereby, it is possible to realize a FH communication available plural channel sharing device.

Figure 10:
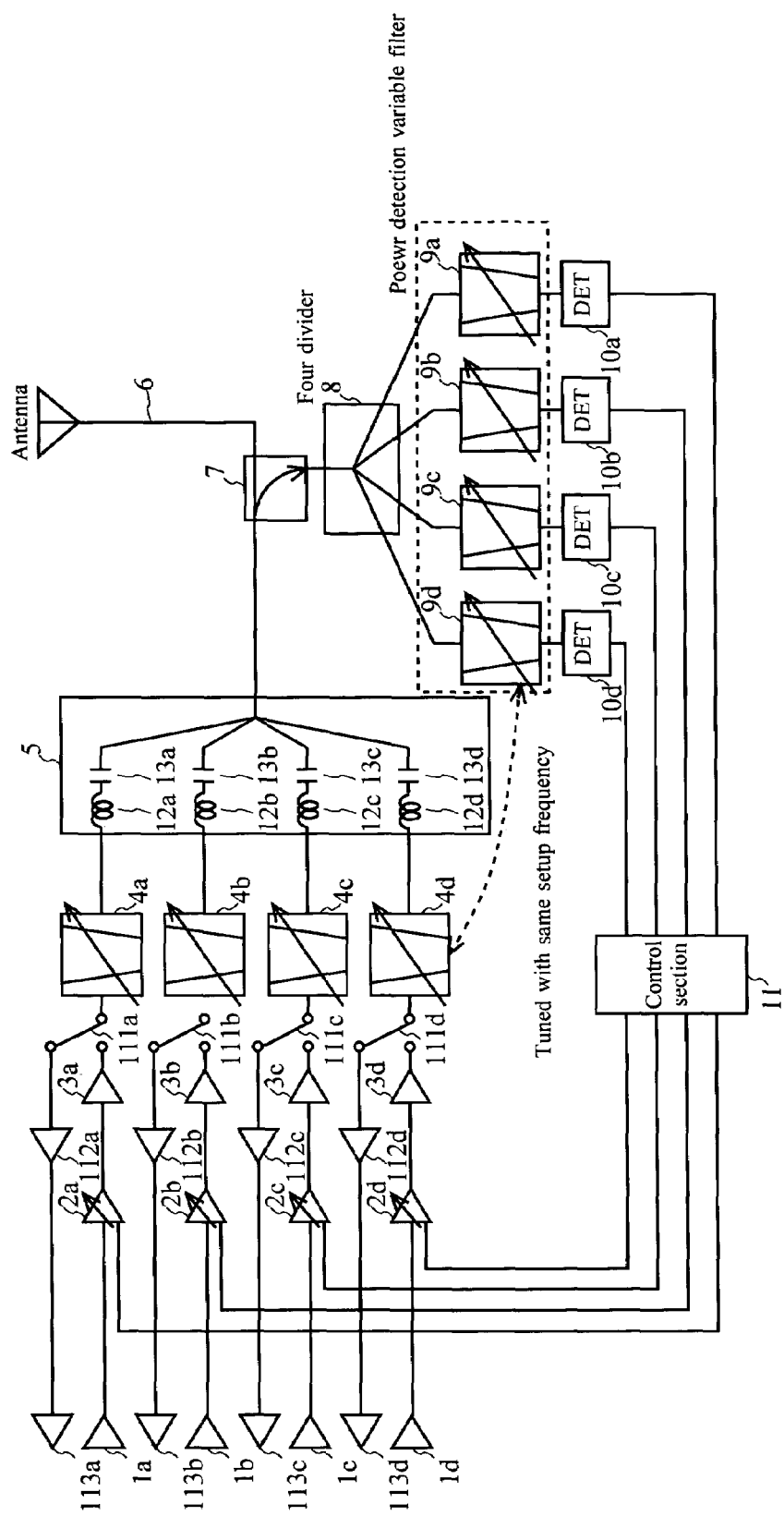
FIG. 10 is a view which shows a configuration example of a wireless communication apparatus having an APC circuit which was equipped with a transmitting and receiving circuit.

In addition, in the wireless communication apparatus of this embodiment, for example, it is possible to realize a relay device by a transmission and reception available plural channel configuration as shown in FIG. 10, in ad-hoc communication. In the configuration of FIG. 10, it is possible to switch transmission and reception by switches 111a to 111d as to each channel, and at the time of reception, a signal, which was received by the antenna 6, is inputted to amplifiers 112a to 112d through the coupling circuit 5 and the variable filters 4a to 4d, and amplified there, and thereafter, outputted from output terminals 113a to 113d.

Meanwhile, in the wireless communication apparatus of this embodiment, as a plurality of channels, four pieces of channels are used, and in addition, a transmission object signal level changing unit is configured by a function of a plurality of the variable amplifiers 2a to 2d, and a transmission filter unit is configured by a function of a plurality of the variable filters 4a to 4d in a transmission path, and a transmission signal coupling unit is configured by a function of the coupling circuit 5, and a coupled signal dividing unit is configured by a function of the directional coupler 7 (coupled signal obtaining unit) and a function of the four divider 8, and a level detection filter unit is configured by a function of a plurality of the variable filters 9a to 9d for power detection, and a signal level changing unit is configured by a function of a plurality of the wave detectors 10a to 10d, and a transmission object signal level change mode controlling unit is configured by a function of the control section 11.

Embodiment 2

A second embodiment of the invention will be described.

Figure 3:
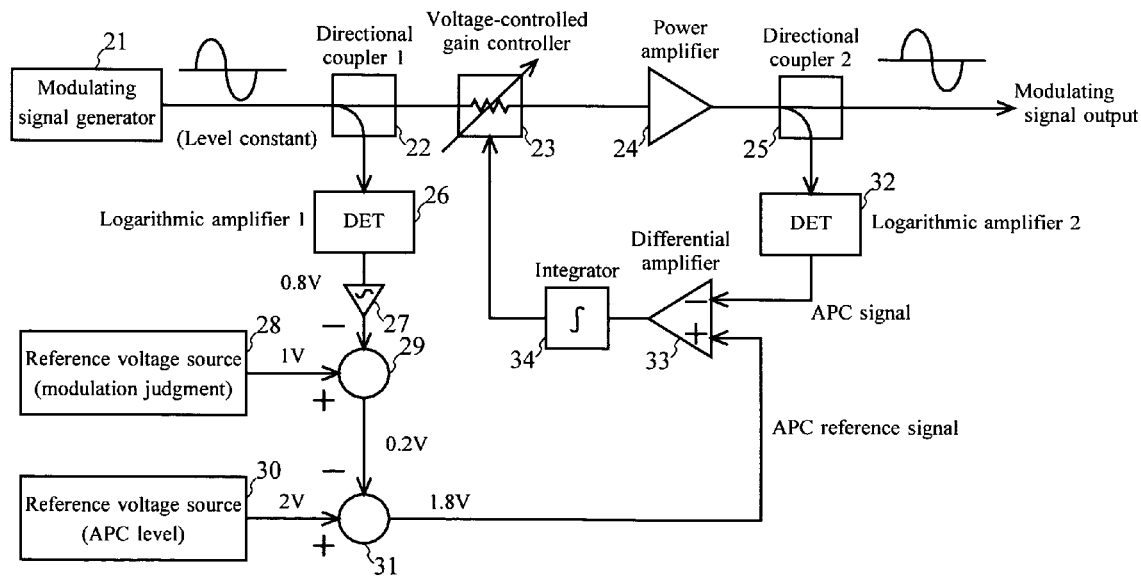
FIG. 3 is a view which shows a configuration example of a wireless communication apparatus which relates to a second embodiment of the invention.

FIG. 3 shows a configuration example of a wireless communication apparatus of this embodiment.

The wireless communication apparatus in this embodiment is equipped with a modulating signal generator 21, a first directional coupler 22, a voltage-controlled gain controller 23, a power amplifier (PA) 24, a second directional coupler 25, a first logarithmic amplifier (wave detector) 26, a filter 27 which is for example, a low pass filter (LPF), a first reference voltage source (modulation judgment) 28, a first adder 29, a second reference voltage source (APC level) 30, a second adder 31, a second logarithmic amplifier (wave detector) 32, a differential amplifier 33, and an integrator 34.

Here, as the first logarithmic amplifier 26 and the second logarithmic amplifier 32, they are configured by wave detectors which have the same wave detection characteristic.

Figure 4:
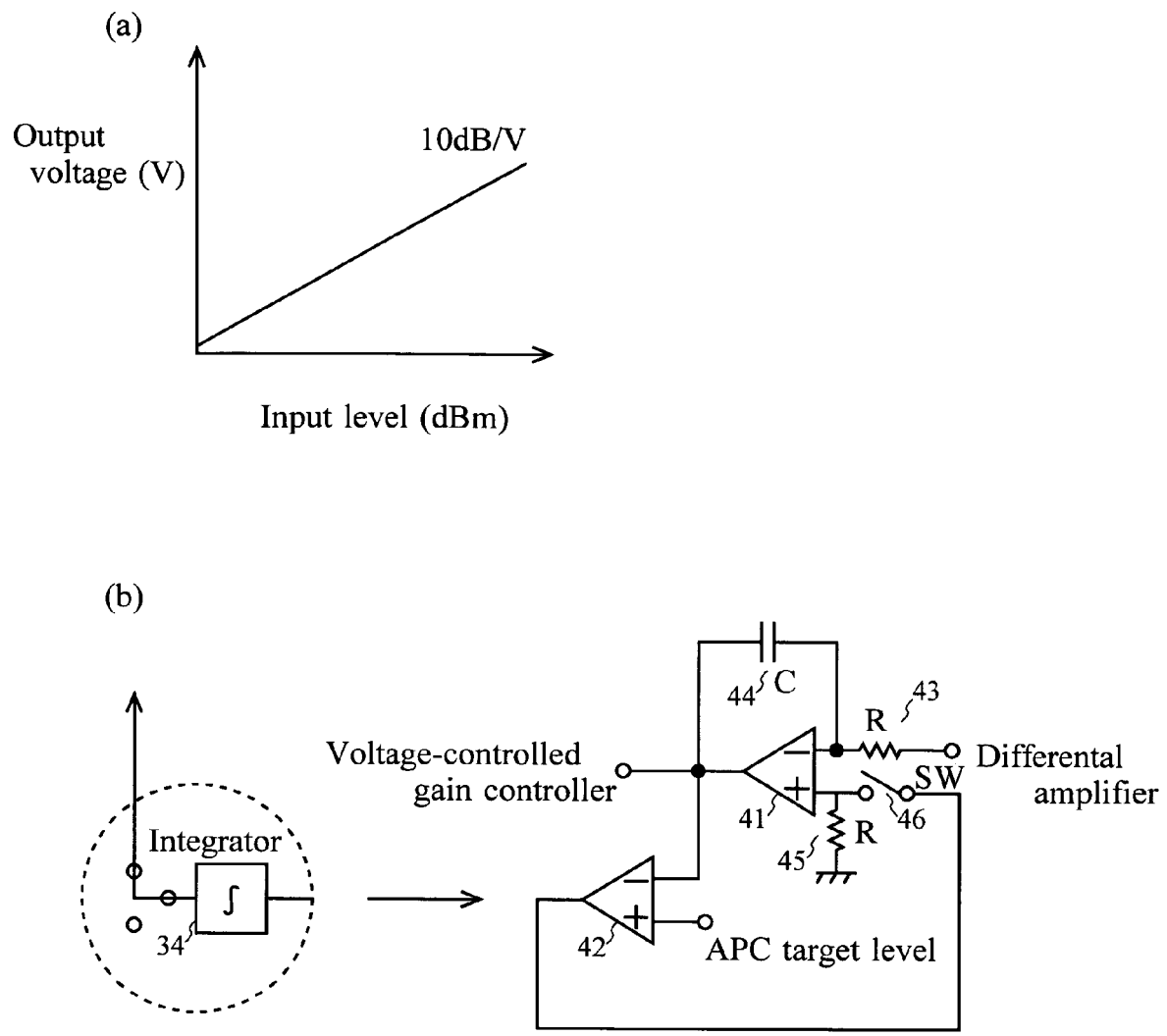
FIG. 4A is a view which shows one example of an output characteristic of a wave detector (logarithmic amplifier)
FIG. 4B is a view which shows one example of an integrator which was configured by an analog circuit.

FIG. 4A shows one example of an input-output characteristic of a wave detector which configures the first logarithmic amplifier 26 and the second logarithmic amplifier 32. A horizontal axis of a graph shows an input level (dBm), and a vertical axis shows an output voltage (V). The example in FIG. 4A shows a case of 10 dB/V.

One example of an operation, which is carried out by the wireless communication apparatus of this embodiment, will be shown.

The modulating signal generator 21 generates a modulating signal of which level (e.g., maximum amplitude) is constant, and outputs it through the first directional coupler 22 to the voltage-controlled gain controller 23.

The voltage-controlled gain controller 23 is configured by for example, a variable attenuator, and controls a level of an input signal, with a gain (in this embodiment, attenuation amount) which is controlled by a signal inputted from the integrator 34, and outputs a signal after the level was controlled, to the power amplifier 24.

The power amplifier 24 amplifies an input signal, and outputs the amplified signal through the second directional coupler 25.

The first directional coupler 22 extracts a part of a modulating signal which is outputted from the modulating signal generator 21 to the voltage-controlled gain controller 23, and outputs the extracted signal to the first logarithmic amplifier 26.

The first logarithmic amplifier 26 detects (logarithmically amplifies) a modulating signal to be inputted, and converts it into a voltage signal (e.g., 0.8V signal), and outputs the wave detection voltage signal to the filter 27.

The filter 27 is configured by for example, an integrator, and carries out filtering of a wave detection voltage signal to be inputted, and outputs it to the first adder 29.

The first reference voltage source (modulation judgment) 28 is a thing which outputs a fixed value which is a value on the basis of a CW (continuance signal) wave, and outputs a signal of a voltage which was defined by CW modulation (e.g., 1V signal) to the first adder 29.

The first adder 29 subtracts (e.g., adds both sides with reversed phase) a wave detection voltage signal which is inputted from the filter 27, from a voltage signal which is inputted from the first reference voltage source (modulation judgment) 28, and outputs a signal of the subtraction result (e.g., 0.2V (=1V−0.8V) signal) to the second adder 31 as a modulation correcting signal. Here, the modulation correcting signal to be converted becomes a difference signal with CW modulation.

The second reference voltage source (APC level) 30 outputs a voltage signal which is high-frequency-outputted by CW modulation (e.g., 2V signal) to the second adder 31.

The second adder 31 subtracts (e.g., adds both sides with reversed phase) a modulation correcting signal which is inputted from the first adder 29, from a voltage signal which is inputted from the second reference voltage source (APC level) 30, and outputs a signal of the subtraction result (e.g., 1.8V (=2V−0.2V) signal) to a plus (+) terminal of the differential amplifier 33 as an APC reference signal. Here, the APC reference signal to be converted becomes a high frequency output difference signal with CW modulation.

The second directional coupler 32 extracts a part of a modulating signal which is outputted from the power amplifier 24, and outputs the extracted signal to the second logarithmic amplifier 32.

The second logarithmic amplifier 32 detects (logarithmically amplifies) a modulating signal to be inputted, and converts it into a voltage signal, and outputs the wave detection voltage signal to a minus (−) terminal of the differential amplifier 33 as an APC signal.

The differential amplifier 33 outputs a signal of a differential amplification result of the APC signal which is inputted from the second logarithmic amplifier 32 and the APC reference signal which is inputted from the second adder 31, to the integrator 34.

The integrator 34 integrates an input signal, and outputs the integration result to the voltage-controlled gain controller 23. By the output signal, a gain (in this embodiment, attenuation amount) of the voltage-controlled gain controller 23 is controlled.

In this embodiment, an APC loop is formed so as to provide a difference signal in such a manner that the APC signal, which is outputted from the second logarithmic amplifier 32, becomes the same value as that of the APC reference signal which is outputted from the second adder 31, and by this means, a level of a modulating signal output becomes constant.

Here, FIG. 4B shows one configuration example in such a case that a component part of the integrator 34 was realized by an analog circuit.

As shown in FIG. 4B, it is possible to configure it by differential amplifiers 41, 42, resistors 43, 45, a capacitor 44, and a switch 46.

In this embodiment, the first logarithmic amplifier 26 and the second logarithmic amplifier 32 have the same wave detection characteristic (in this embodiment, 10 dB/V), and therefore, a slope of the APC signal, which is outputted from the second logarithmic amplifier 32, equals to a slope of the APC reference signal which is outputted from the second adder 31, and it is possible to carry out output correction with the same slope as that of modulation information which is included in the APC reference signal. In sum, in this embodiment, there is not processing section which is dependent on a modulation system, and it is possible to correspond to any modulation system by outputting an offset which corresponds to a modulation system through the use of the first directional coupler 22 and the first logarithmic amplifier 26.

In addition, for example, in case that a thing which performs power detection by a ready-made DBM was used as the logarithmic amplifiers 26, 32 in which input power (dBm) and an output voltage (V) fall in a proportionality relation, there is such a possibility that fluctuation with a level of plus-minus (±) 0.2V occurs at an output from the logarithmic amplifier, as fluctuation of characteristics between the input side first logarithmic amplifier 26 and the output side second logarithmic amplifier 32, but linearity is good. In this regard, however, when it is tried to heighten accuracy, for example, there is such a case that it is effective to provide a slope correcting circuit which corrects a slope of an input and an output of the logarithmic amplifier, at a subsequent stage of the first logarithmic amplifier 26 and at a subsequent stage of the second logarithmic amplifier 32, and as one example, as a simple correcting circuit, conceivable is a volume which corrects a level of plus-minus (±) 0.2V.

In addition, for example, there can occur such a case that wave detection response time differs since an input level is different at the first logarithmic amplifier 26 and at the second logarithmic amplifier 32, but it occurs only such a moment that a transmission level was changed, and an influence of an error is restrictive. In addition, an error of APC can be allowed with plus-minus (±) 5 dB, and there is not a specific influence.

In addition, in this embodiment, it is premised on such a matter that a direct current signal is given to a path for obtaining a signal from the first directional coupler 22 and inputting the APC reference signal to the differential amplifier 33, as one for giving a reference, and therefore, it is desirable to dispose a filter (e.g., integrator) 27 right after the first logarithmic amplifier 26 like this embodiment, regardless of a modulation system. In addition, for example, it is possible to dispose a delay device which compensates a delay time difference, in lieu of the filter 27. In case that the suchlike filter 27 or delay device is not disposed, there is such a possibility to occur such a matter that an output of the differential amplifier 33 flip-flops, due to a delay time difference with a path for inputting the APC signal to the differential amplifier 33, through the power amplifier 24, and via the second directional coupler 25.

Figure 5:
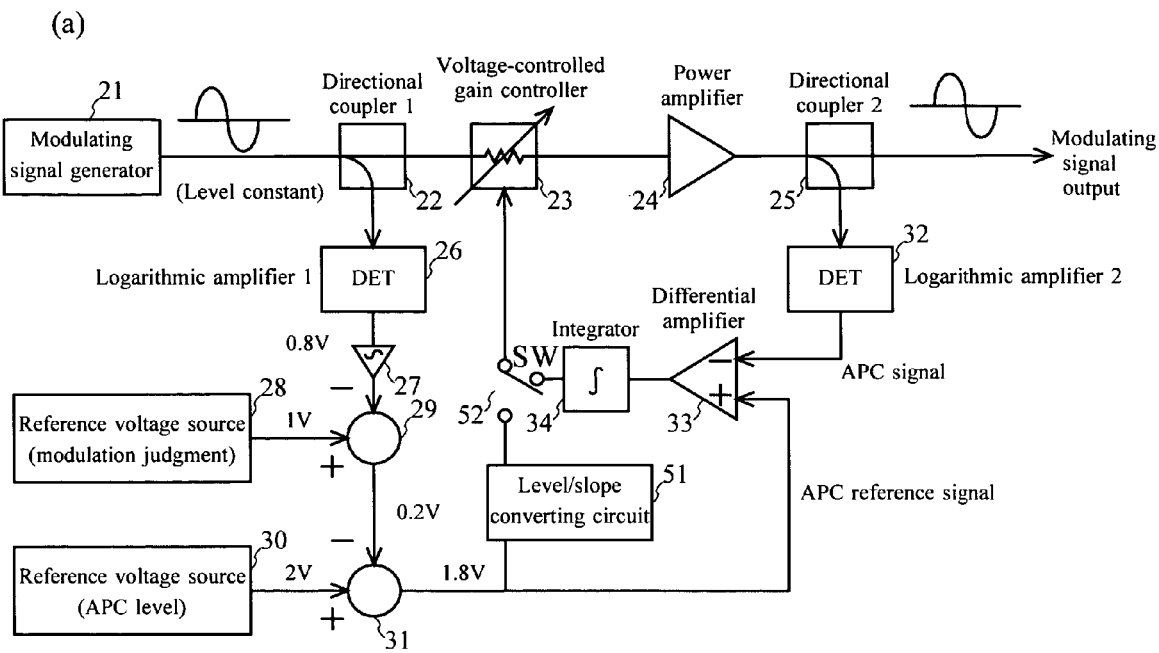
FIG. 5A is a view which shows a modification example of the wireless communication apparatus which relates to the second embodiment of the invention.
FIG. 5B is a view which shows one example of an output from a level/slope converting circuit.
Figure 6:
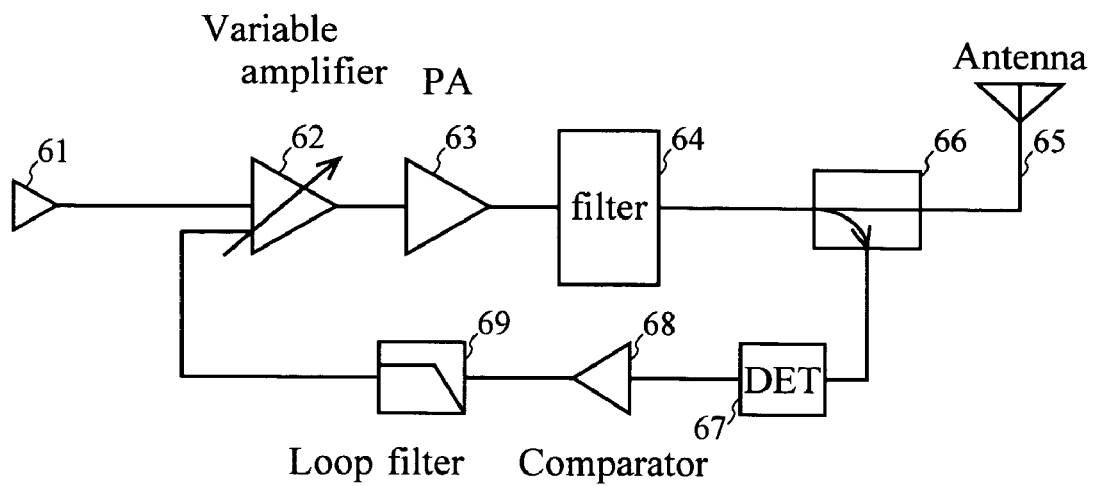
FIG. 6 is a view which shows a configuration example of a wireless communication apparatus which adopted a 1ch APC control system.
Figure 7:
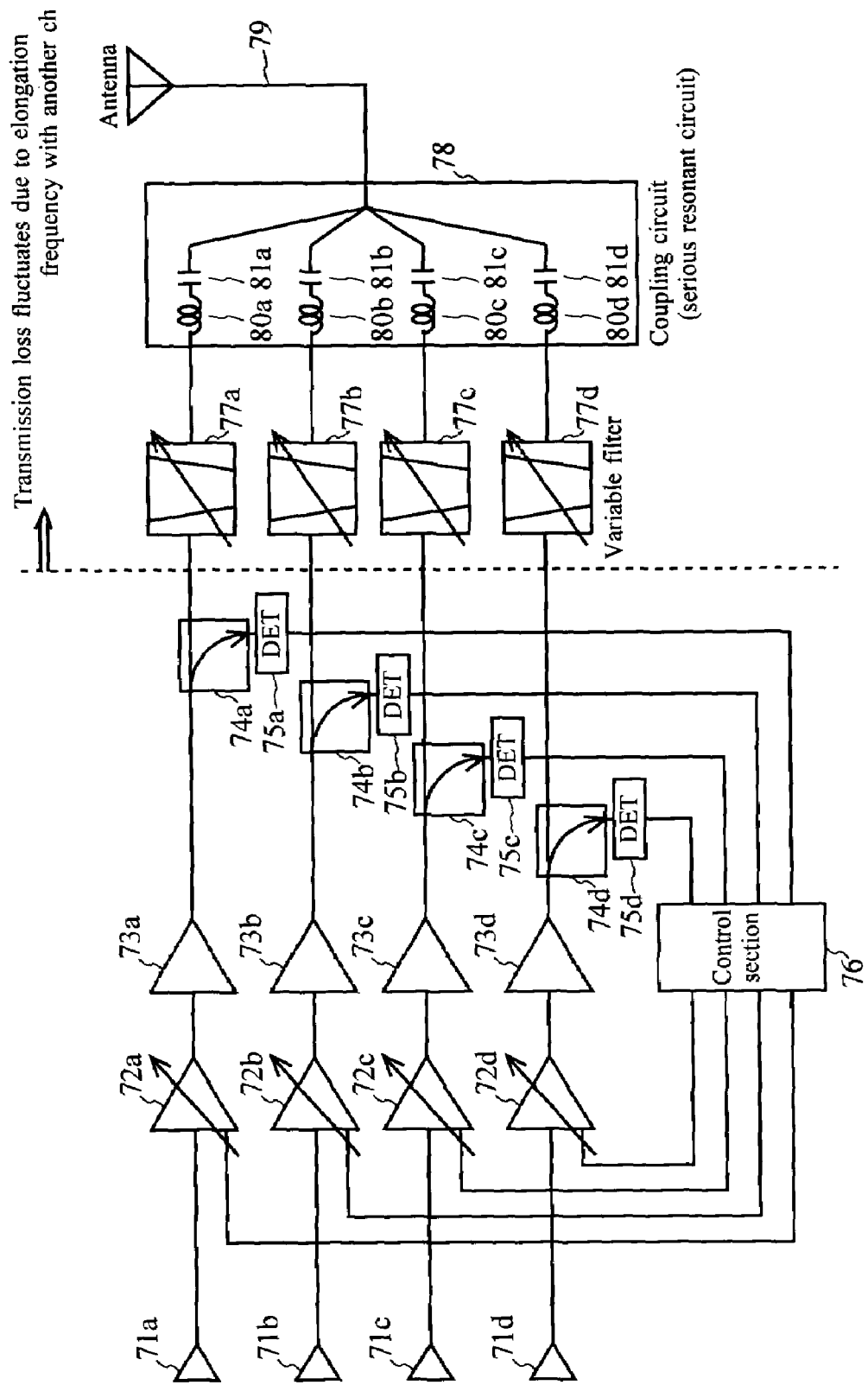
FIG. 7 is a view which shows a configuration example of a wireless communication apparatus which adopted a 4ch APC control system.
Figure 8:
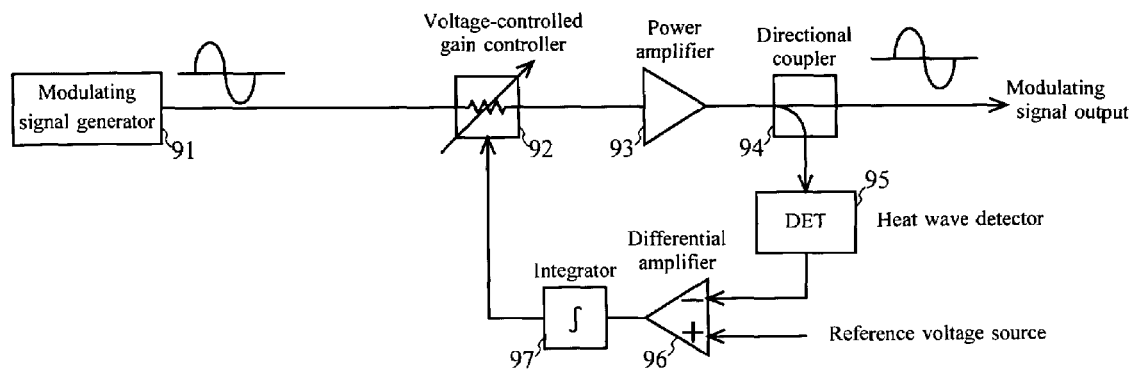
FIG. 8 is a view which shows a configuration example of a wireless communication apparatus having an APC circuit which used a heat wave detector.
Figure 9:
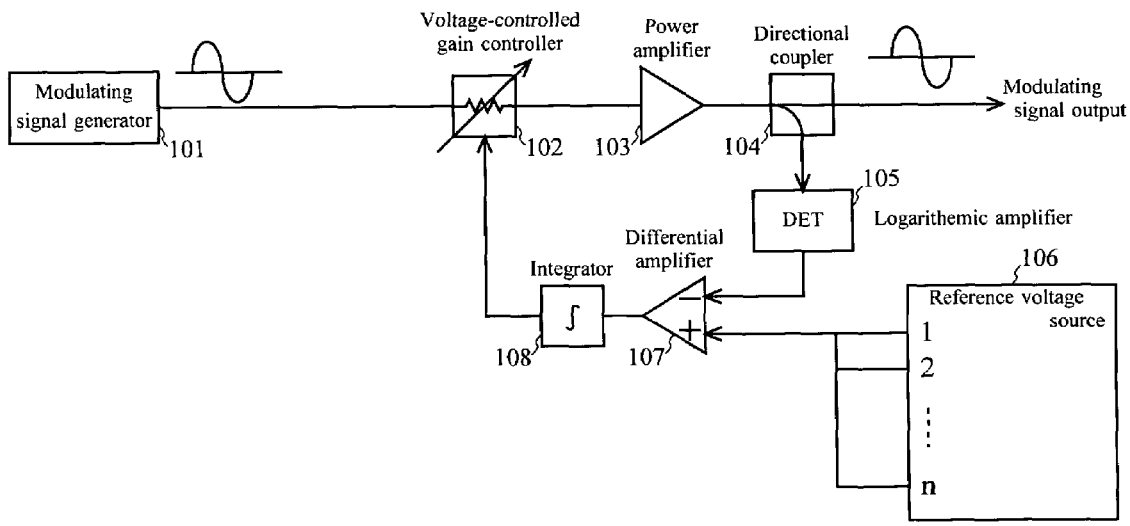
FIG. 9 is a view which shows a configuration example of a wireless communication apparatus having an APC circuit which used a modulation correction coefficient.

FIG. 5A shows a modified configuration example of the wireless communication apparatus of this embodiment.

The wireless communication apparatus shown in FIG. 5A is further equipped with a level/slope converting circuit 51, and a switch 52, in a similar configuration to that of the wireless communication apparatus shown in FIG. 3.

The level/slope converting circuit 51 level/slope converts a signal which is outputted from the second adder 31, and then, outputs it.

The switch 52 switches an output from the level/slope converting circuit 51 and an output form the integrator 34, and has one output inputted, as a gain control signal of the voltage-controlled gain controller 23.

In this embodiment, on the occasion of switching a modulation system to the FH system, a value which is expected in advance (in this embodiment an output value from the level/slope converting circuit 51) is applied to the voltage-controlled gain controller 23, until an output value from the integrator 34 converges, and when the output value from the integrator 34 became nearly the same, the output value from the integrator 34 is used, and thereby, it is possible to reduce a power control error until it converges.

In addition, in case of fully corresponding to the FH system, for example, it is desirable to dispose a similar mechanism which outputs an interim value, during such a period that an output value from the filter (LPF) 27 becomes stable after a modulation system was changed.

FIG. 5B shows one example of a signal for switching over the switch 52 (SW switching signal), one example of an output value from the integrator 34, and one example of an output value from the level/slope converting circuit 51.

As shown in FIG. 5B, in the early stage, the switch 52 is switching-controlled in such a manner that an output value from the level/slope converting circuit 51 is inputted through the switch 52 to the voltage-controlled gain controller 23, and after that, when an output value from the integrator 34 becomes the same value as an output value from the level/slope converting circuit 51, the switch 52 is switching-controlled in such a manner that an output value from the integrator 34 is inputted through the switch 52 to the voltage-controlled gain controller 23.

In this way, the level/slope converting circuit 51 calculates and outputs a voltage to be applied to the voltage-controlled gain controller 23, on the basis of target power of APC. The voltage-controlled gain controller 23 carries out control, of an open loop, on the basis of a voltage from the level/slope converting circuit 51, until an output value from the integrator 34 becomes stable.

As above, the wireless communication apparatus of this embodiment was equipped with a first coupler (in this embodiment, the first directional coupler 22) which bifurcates an input signal to a transmission amplifier (in this embodiment, the power amplifier 24), a first detector (in this embodiment, the first logarithmic amplifier 26) which detects a level of an output of the first coupler, a second coupler (in this embodiment, the second directional coupler 25) which bifurcates an output signal from the transmission amplifier, a second detector (in this embodiment, the second logarithmic amplifier 32) which detects a level of an output from the second coupler, an adder (in this embodiment, the first adder 29 and the second adder 31) which synthesizes, in the manner of addition, an output from the first detector and a value which corresponds to target transmission power which is not dependent on a modulation system, the differential amplifier 33 which amplifies a difference of an output from the adder and an output from the second detector, and a low pass filter (in this embodiment, the integrator 34) which carries out filtering of an output from the differential amplifier 33 and outputs it as a gain control signal of the transmission amplifier.

In this way, in an APC loop of the wireless communication apparatus of this embodiment, predetermined modulation is used as a reference signal (voltage which was defined in CW modulation), and a voltage signal as a result of subtracting an input wave detection voltage signal from the reference signal is used as a modulation correcting signal, and then, a difference voltage of the modulation correcting signal and the APC reference voltage (voltage which is high-frequency outputted in CW modulation) is used as a reference voltage of the differential amplifier 33. Here, the input side detector (first logarithmic amplifier 26) is one for giving a reference of each modulation system. In the APC loop of the wireless communication apparatus of this embodiment, for example, it is possible to carry out control of APC by detecting transmission power with respect to each channel in the FH system.

In addition, in the APC loop of the wireless communication apparatus of this embodiment, it is possible to carry out modulation correction, and concretely speaking, the same characteristic is given to a detector (the first logarithmic amplifier 26) disposed on the input side of the power amplifier 24 for carrying out modulation correction and a detector (the second logarithmic amplifier 32) disposed on the output side of the power amplifier 24 for detecting high frequency power, and a difference of output from the both detectors is controlled to a target value, and thereby, APC, which is not dependent on a modulation system, is possible, and it is possible to carry out control of APC independently from a modulation system.

Therefore, in the wireless modulation apparatus of this embodiment, for example, in APC which corresponds to a case of carrying out modulation of a multi mode which is applied to software radio transmission etc., it is possible to realize APC which is blind to response time of a detector (in this embodiment, the logarithmic amplifiers 26, 32), and to realize an inexpensive configuration, which has no need to have a plurality (e.g., same number as the number of modulation systems) of reference voltages of APC, and to realize APC which has no bounds in the number of modulations which can be controlled, and to realize APC which does not require a signal for identifying a modulation.

Meanwhile, in the wireless communication apparatus of this embodiment, for example, as to individual channel among a plurality of channels, a modulation signal level changing unit is configured by a function of the voltage-controlled gain controller 23, and a pre-level change modulating signal level detecting unit is configured by a function of a first directional coupler (pre-level change modulating signal obtaining unit) and a function of the first logarithmic amplifier 26, and a level filter unit is configured by a function of the filter 27, and a detection level predetermined value synthesizing unit is configured by a function of the first reference voltage source (modulation judgment) 28, a function of the first adder 29, a function of the second reference voltage source (APC level) 30 and a function of the second adder 31, and a post-level change modulating signal level detecting unit is configured by a function of a second directional coupler (post-level change modulating signal obtaining unit) and a function of the second logarithmic amplifier 32, and a modulating signal level change mode controlling unit is configured by a function of the differential amplifier 33 and a function of the integrator (control signal filter unit) 34.

Here, as a configuration of a communication apparatus etc. which relate to the invention, it is not necessarily limited to one shown above, and various configurations may be used. In addition, it is possible for the invention to provide, for example, a method or a system which carries out processing relating to the invention, a program for realizing the suchlike method and system and a recording medium for recording the program, etc., and in addition, it is also possible to provide as various devices and systems such as a transmitter, a transmitting device, a radio machine, a radio device, a communication device, and a communication system.

In addition, an applicable field of the invention is not necessarily limited to one shown above, and it is possible to apply the invention to various fields.

In addition, as various processing which is carried out in a communication apparatus etc. which relate to the invention, for example it may be all right to use a configuration which is controlled by a processor's executing a control program which is stored in ROM (Read Only Memory) in a hardware source which was equipped with a processor, a memory etc., and in addition, for example, it is all right even if each functional unit for carrying out the processing is configured as an independent hardware circuit.

In addition, it is possible to get hold of the invention as a computer readable recording medium such as a floppy (registered trade mark) disk and CD (Compact Disc)-ROM which stored the above-described control program and the program (itself), and it is possible to perform processing which relates to the invention, by having a processor executed the control program after it is inputted from the recording medium to a computer.

What is claimed is:

1. A communication apparatus which communicates a signal, comprising:
   a transmission object signal level changing unit which changes a level of a signal which becomes, as to each of plural channels, a transmission object of each channel;
   a transmission filter unit which carries out filtering for a signal of each channel, of which a level was changed by the transmission object signal level changing unit, by a filtering characteristic for allowing passage of a frequency component of each channel, as to each of the plural channels;

a transmission signal coupling unit which couples signals of the plural channels, for which filtering was carried out by the transmission filter unit;

an antenna which transmits a signal which was coupled by the transmission signal coupling unit, by wireless;

a coupled signal dividing unit which divides a part of the coupled signal which is outputted from the transmission signal coupling unit to the antenna, into a plurality of signals;

a level detection filter unit which carries out filtering each divided signal which was divided up by the coupled signal dividing unit, by a filtering characteristic which is tuned to an identical frequency to that of the filtering characteristic of the transmission filter unit, as to each of the plural channels;

a signal level detecting unit which detects a level of a signal of each channel, which was obtained by filtering due to the level detection filter unit; and a transmission object signal level change mode controlling unit which controls a mode of changing a level of a signal which becomes a transmission object of each channel, by the transmission object signal level changing unit, on the basis of a level of a signal of each channel, which was detected by the signal level detecting unit.

2. The communication apparatus as set forth in claim 1, wherein the transmission object signal level changing unit is configured by a plurality of variable amplifiers, and the transmission filter unit is configured by a plurality of variable filters, and the transmission signal coupling unit is configured by a coupling circuit which couples a plurality of signals through a plurality of series resonant circuits, and the coupled signal dividing unit is configured by a directional coupler and a four divider, and the level detection filter unit is configured by a plurality of variable filters, and the signal level detecting unit is configured by a plurality of wave detectors, and the transmission object signal level change mode controlling unit is configured by a control section.

3. The communication apparatus as set forth in claim 2, wherein a plurality of power amplifiers are disposed between the plurality of variable amplifiers which configure the transmission object signal level changing unit, and the plurality of variable filters which configure the transmission filter unit.

4. The communication apparatus as set forth in claim 3, wherein an attenuator is disposed between the four divider which configures the coupled signal dividing unit, and the plurality of variable filters which configure the level detection filter unit.

5. The communication apparatus as set forth in claim 1, wherein the communication apparatus is a wireless communication apparatus which carries out multicarrier communication by a frequency hopping system.

6. The communication apparatus as set forth in claim 2, wherein the communication apparatus is a wireless communication apparatus which carries out multicarrier communication by a frequency hopping system.

7. The communication apparatus as set forth in claim 3, wherein the communication apparatus is a wireless communication apparatus which carries out multicarrier communication by a frequency hopping system.

8. The communication apparatus as set forth in claim 4, wherein the communication apparatus is a wireless communication apparatus which carries out multicarrier communication by a frequency hopping system.

9. A communication apparatus which communicates a signal, comprising:

a transmission object signal level changing unit which changes a level of a signal which becomes, as to each of plural channels, a transmission object of each channel;

a transmission filter unit which carries out filtering for a signal of each channel, of which a level was changed by the transmission object signal level changing unit, by a filtering characteristic for allowing passage of a frequency component of each channel, as to each of the plural channels;

a transmission signal coupling unit which couples signals of the plural channels, for which filtering was carried out by the transmission filter unit;

an antenna which transmits a signal which was coupled by the transmission signal coupling unit, by wireless;

a pre-level change signal level detecting unit which detects a level of a signal before its level is changed by the transmission object signal level changing unit, as to each of the plural channels;

a detection level predetermined value synthesizing unit which synthesizes a level which was detected by the pre-level change signal level detecting unit, as to each of the plural channels, and a predetermined value based on a transmission level which becomes a target and is independent of a modulation system;

a coupled signal dividing unit which divides a part of the coupled signal which is outputted from the transmission signal coupling unit to the antenna, into a plurality of signals;

a level detection filter unit which carries out filtering each divided signal which was divided up by the coupled signal dividing unit, by a filtering characteristic which is tuned to an identical frequency to that of the filtering characteristic of the transmission filter unit, as to each of the plural channels;

a signal level detecting unit which detects a level of a signal of each channel, which was obtained by filtering due to the level detection filter unit by a detection characteristic identical to that of the pre-level change signal level detecting unit; and a transmission object signal level change mode controlling unit which controls a mode of changing a level of a signal which becomes a transmission object, by the transmission object signal level changing unit, on the basis of a difference of a synthesis result by the detection level predetermined value synthesizing unit and a level which was detected by the signal level detecting unit as to each of the plural channels.

* * * * *